(12) United States Patent
Kyler et al.

(10) Patent No.: US 6,334,929 B1
(45) Date of Patent: Jan. 1, 2002

(54) PLASMA PROCESSING METHOD

(75) Inventors: Kelly W. Kyler, Chandler; Fred Clayton, Mesa; James H. Williams, Tempe; Jaeshin Cho, Chandler; Craig L. Jasper, Phoenix, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/282,295

(22) Filed: Jul. 29, 1994

(51) Int. Cl.[7] .................................................. B44C 1/22
(52) U.S. Cl. ....................................................... 156/625
(58) Field of Search ................................ 156/643, 657, 156/662; 437/228

(56) References Cited

U.S. PATENT DOCUMENTS

| | | | | |
|---|---|---|---|---|
| 4,662,956 A | * | 5/1987 | Roth et al. | 156/643 X |
| 4,952,446 A | * | 8/1990 | Lee et al. | 156/662 X |
| 5,296,385 A | * | 3/1994 | Moslehi et al. | 437/228 X |

* cited by examiner

*Primary Examiner*—Thi Dang
(74) *Attorney, Agent, or Firm*—Robert F. Hightower

(57) ABSTRACT

A process for improving uniformity across the surface of a substrate during a plasma process such as plasma etching. A conductive plane is formed at the back surface of the substrate. A plasma process is then performed to the front surface of the substrate. The conductive plane may then be removed upon completion of the plasma process and before final processing steps.

16 Claims, 2 Drawing Sheets

PLASMA PROCESSING METHOD

Field of the Invention

This invention relates, in general, to a method of processing semiconductor materials, and more particularly, to a plasma processing method for a high resistivity substrate such as gallium arsenide (GaAs).

Background of the Invention

During plasma processing, such as plasma etching or plasma enhanced chemical vapor deposition (PECVD), high resistivity substrates show a significantly higher nonuniformity across the surface of the substrate as compared to low resistivity substrates. This nonuniformity can be characterized into two major types. One, a gross nonuniformity across the entire front surface of the substrate, and two, localized nonuniformities at certain portions at the front surface of the substrate due to a replication of the features from the transfer assembly. These features may include lifter pin marks or backside He cooling channels in the lower electrode.

For example, the surface of a GaAs substrate after oxide deposition may be 1% nonuniform. However, after plasma etching, the nonuniformity of the surface may rise to over 15%. Further, as the diameter of the substrate increases, the surface nonuniformity substantially increases.

Surface uniformity, which means the uniformity of the etch process or deposition process, is critical for fabricating devices with minimal process damage. By significantly improving the gross uniformity across the front surface of the substrate and by eliminating localized areas of nonuniformity, yields can be improved and device performance reliably optimized.

Accordingly, it is highly desirable to have a method for improving surface uniformity across the surface of a substrate during plasma processing and eliminating the problems associated with nonuniformity.

DETAILED DESCRIPTION OF THE DRAWINGS

Plasma processing relies upon maintaining good electrical coupling between the electrodes used in the processing. However, good electrical coupling becomes increasing difficult to maintain when high resistivity substrates such as III-V semiconductor substrates are processed. For example, GaAs substrates, which generally have a resistivity of over 100,000 times greater than that of silicon (Si) substrates, typically experience gross surface nonuniformities that are three to four times greater than that of nonuniformities of Si substrates undergoing the same process. The present invention provides a method for improving the surface uniformity of a substrate undergoing a plasma process. Although the present invention is especially effective for high resistivity, insulating, or semi-insulating substrates such as III-V semiconductor substrates, it will be apparent to those skilled in the art that the benefits of the present invention may be seen using other substrates, including high resistivity Si substrates.

Figure 1:
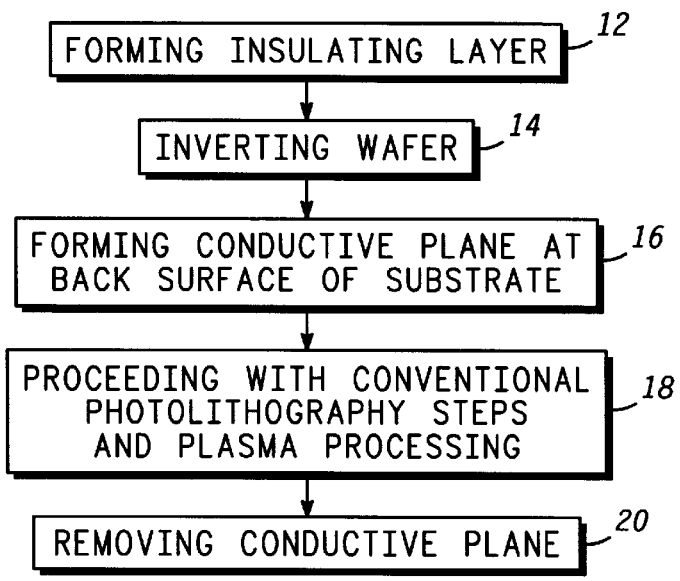
FIG. 1 is a flowchart showing a preferred process sequence in accordance with the present invention.

FIG. 1 illustrates a preferred plasma processing sequence in accordance with the present invention. Although other semiconductor substrates may be used, a GaAs substrate will be described in this embodiment.

At step 12 in FIG. 1, an insulating layer, such as a field oxide layer or a photoresist layer, is formed on the front surface of a GaAs substrate using conventional techniques well-known in the art. In one embodiment of the invention a silicon nitride layer (nitride layer) of 200 to 1000 Angstroms is deposited on the front surface of the GaAs substrate using PECVD techniques. A silicon dioxide layer (oxide layer) of approximately 3000 to 4000 Angstroms is then formed above the nitride layer. At step 14, the GaAs substrate is then inverted to reveal its back surface.

At step 16, a conductive plane is then formed either internally or externally at the back surface of the GaAs substrate.

Figure 2:
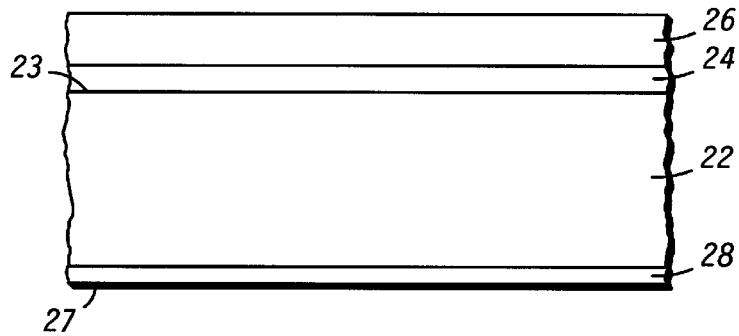
FIG. 2 is a simplified cross-sectional view of a semiconductor substrate during an intermediate stage of processing in accordance with one embodiment of the present invention.
Figure 3:
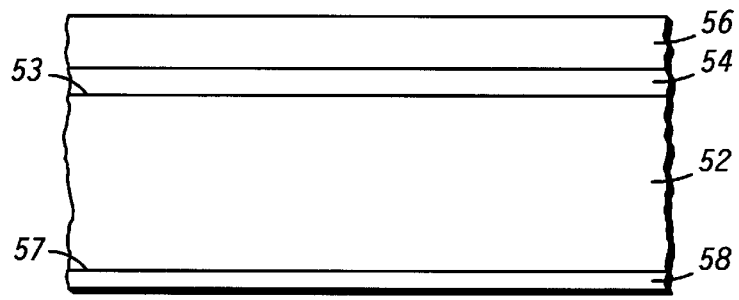
FIG. 3 is a simplified cross-sectional view of a semiconductor substrate during an intermediate stage of processing in accordance with another embodiment of the present invention.

FIGS. 2 and 3 show an internal conductive plane and an external conductive plane, respectively, at this stage of processing in accordance with the present invention.

In a preferred embodiment of the present invention, shown in FIG. 2, a nitride layer 24 and an oxide layer 26 are formed over a front surface 23 of a GaAs substrate 22. An internal conductive plane 28 (internal to GaAs substrate 22) is formed beneath a back surface 27 of GaAs substrate 22. Internal conductive plane 28 may be formed by conventional ion implantation techniques using either n-type or p-type dopants and may be easily integrated with other process steps. Preferably, a Si dopant, at a dosage of $1 \times 10^{10}$ to $5 \times 10^{15}$ atoms/cm$^2$, is implanted to a depth of approximately 0.1 to 1.5 µm from back surface 27 of GaAs substrate 22. However, it should be noted that it is not necessary to make internal conductive plane 28 very conductive to affect drastic improvements in surface uniformity.

The effectiveness of internal conductive plane 28 may be further increased by electrically activating the dopants through conventional annealing techniques such as furnace anneal or rapid thermal anneal (RTA). A furnace anneal or RTA at 550° C. will provide 20 to 30% activation of the implants, while a furnace anneal or RTA of 850–900° C. will provide nearly 70% activation.

Internal conductive plane 28 is preferred because there are no concerns about the effect of internal conductive plane 28 on the remainder of the processing steps to which GaAs substrate 22 will be exposed.

FIG. 3 shows another embodiment of the present invention. In this embodiment, a nitride layer 54 and an oxide layer 56 are formed over a front surface 53 of a GaAs substrate 52. An external conductive plane 58 is formed over a back surface 57 of GaAs substrate 52. External conductive plane 58 may be comprised of a metal layer or a doped region formed in a thin film, such as Si or GaAs, formed on GaAs substrate 52.

Preferably, external conductive plane 58 is a metal layer comprised of such materials as titanium tungsten (TiW), titanium tungsten nitride (TiWN), gold (Au), aluminum (Al), copper (Cu) or any refractory metal that will withstand the temperatures of future processing steps. Typically, external conductive plane 58 has a thickness of approximately 2000 to 5000 Angstroms, however, other thicknesses are, of course, possible. External conductive plane 58 may be easily integrated into a device process by forming it with the same material and thickness as the gate of the device.

Returning to FIG. 1, at step 18, conventional photolithography steps and plasma processing, such as plasma etching, are performed.

Before packaging, the internal or external conductive plane may, depending on the application, either be left intact at the back surface of the substrate or, as shown at step 20, be removed by conventional techniques such as polishing, grinding, or wet chemistry. For example, if an external conductive plane is used, it may be left over the back surface of the substrate to be used as an electrical contact or to enhance its electrical conductivity. On the other hand, if the substrate requires thinning, the conductive plane may be removed.

It should be noted that the above processing sequence is only illustrative of a preferred embodiment of the present invention and that it is possible to achieve the novel effects of the present invention by performing the above process steps in a different order or by even removing some of the steps. For example, it is not necessary to form an insulating layer over the front surface of the substrate before forming the conductive plane at the back surface of the substrate. However, if the insulating layer is formed first, the GaAs substrate can be protected from being scratched when the substrate is inverted. It is important, however, that the conductive plane be formed at the back surface of the substrate before any critical plasma etch or other plasma process is performed.

Figure 4:
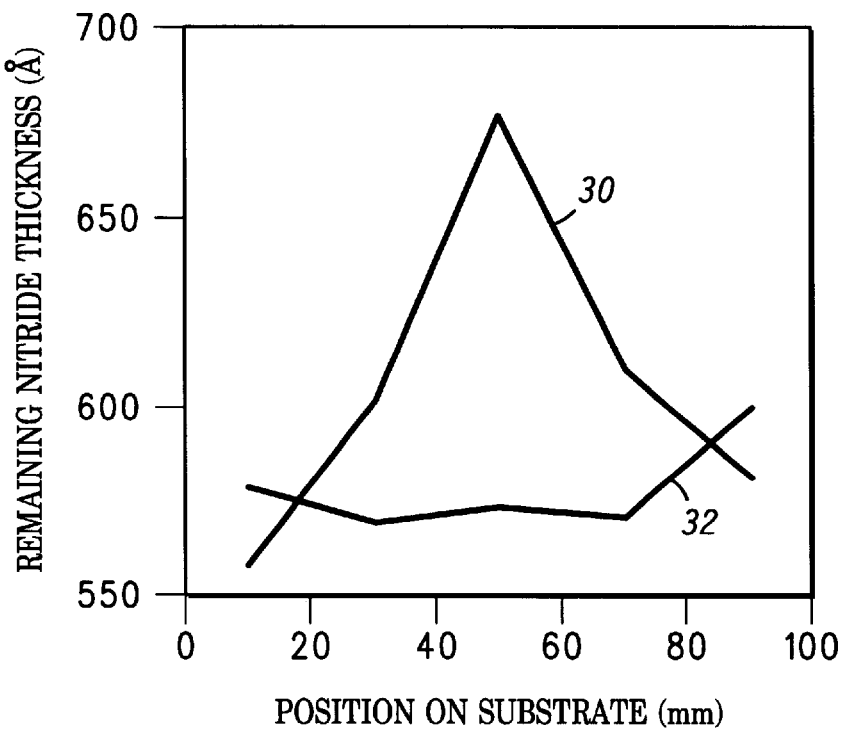
FIG. 4 is a graphic representation showing the nitride thickness on a substrate after plasma etching of an oxide layer overlying the nitride layer for a conventional GaAs substrate and for a GaAs substrate with a conductive plane in accordance with the present invention.
Figure 5:
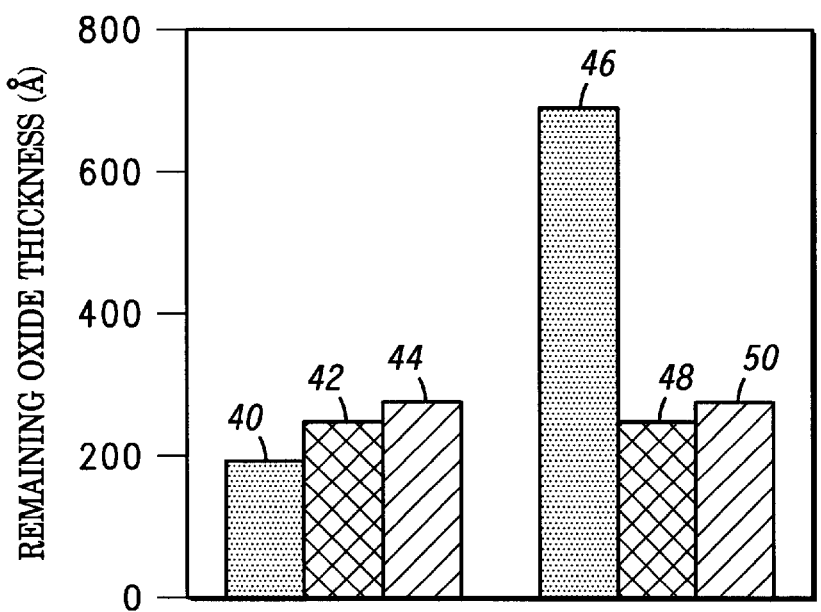
FIG. 5 is a graph showing the oxide thickness after plasma etching at a lifter pin location for a conventional GaAs substrate and for two GaAs substrates in accordance with the present invention.

As shown in FIGS. 4 and 5, by forming a conductive plane at the back surface of a substrate before plasma processing in accordance with the present invention, both gross nonuniformity across the surface of the substrate as well as localized areas of nonuniformity can be improved.

FIG. 4 is a graph showing the thickness of a nitride layer on the surface of a GaAs substrate after plasma etching of an oxide layer overlying the nitride layer at certain positions on a GaAs substrate with diameter of 100 mm. Before plasma etching, a 750 Angstroms nitride layer and 3000 Angstroms oxide layer were deposited. During plasma etch of the oxide layer, some of the nitride layer gets etched.

As shown at curve 30 of FIG. 4, the resulting nitride layer thickness after plasma etching is significantly nonuniform. The center of the substrate has a nitride layer thickness of over 100 Angstroms greater than the nitride layer thickness at the edges of the substrate.

Curve 32 shows, under similar conditions, the remaining nitride thickness after plasma etching for a GaAs substrate formed with a doped region in accordance with the present invention. This doped region is formed by implanting Si at a dosage of $5 \times 10^{13}$ atoms/cm$^2$ at 150 KeV and 75 KeV. As can be seen, the present invention produces a nitride layer having a substantially uniform thickness across the entire surface of the substrate.

FIG. 5 is a bar graph depicting the thickness of an oxide layer after plasma etching the 3500 Angstroms oxide layer at a lifter pin location for a conventional GaAs substrate and for two embodiments in accordance with the present invention. Bars 40 and 46 show the oxide thickness for a GaAs substrate without a conductive plane for the average oxide layer thickness above the entire substrate and for the oxide layer thickness directly above the lifter pin, respectively. As is evident, there is a large disparity between these two oxide layer thicknesses. This nonuniformity results in the problems discussed above.

Bars 42 and 48 show the average remaining oxide layer thickness across the substrate and the remaining oxide thickness above the lifter pin location, respectively, for a GaAs substrate with a doped region formed by ion implantation in accordance with an embodiment of the present invention. Bars 44 and 50 show the average remaining oxide layer thickness across the substrate and the remaining oxide layer thickness above the lifter pin location, respectively, for a GaAs substrate formed with a 4000 Angstroms TiWN layer in accordance with another embodiment of the present invention.

As can be seen, the oxide layer thickness above the lifter pin locations for the GaAs substrates with conductive planes are approximately equal to the average oxide thickness across the entire GaAs substrate. Therefore, the present invention provides for uniformity at localized areas on the surface as well.

Thus, in accordance with the present invention, gross uniformity across the entire surface of the substrate as well as localized areas of nonuniformity are significantly improved. Further, substrate degradation due to extended over-etches is reduced and yields improved.

While the present invention has been described in conjunction with several specific embodiments, it is evident to those skilled in the art that further alternatives, modifications, and variations will be apparent in light of the foregoing description. The invention described herein is intended to embrace all such alternatives, modifications, variations and applications as may fall within the spirit and scope of the appended claims.

What is claimed is:

1. A method of processing a substrate comprising the steps of:
   providing a substrate comprised of a III-V semiconductor material with a front surface and a back surface;
   implanting a dopant into said back surface of said substrate to form a doped region; and
   performing a plasma process to said front surface of said substrate after said step of implanting a dopant, wherein the uniformity of the plasma process is improved by the presence of the doped region.

2. The method of claim 1 wherein said plasma process is comprised of plasma etching.

3. The method of claim 1 wherein said dopant is implanted at a dosage of $1 \times 10^{10}$ to $5 \times 10^{15}$ atoms/cm$^2$.

4. The method of claim 1 wherein said dopant is implanted to a depth of 0.1 to 1.5 $\mu$m from said back surface of said substrate.

5. The method of claim 1 further comprising the step of annealing said substrate to activate said dopant before said step of performing a plasma process.

6. The method of claim 1 wherein said step of providing a substrate comprises providing a substrate comprised of gallium arsenide.

7. The method of claim 1 further comprising the step of removing said doped region from said substrate after performing said plasma process.

8. The method of claim 7 wherein said step of removing said doped region is performed by polishing.

9. The method of claim 1 wherein said step of providing a substrate comprises providing a semiconductor substrate.

10. A method of plasma etching a semiconductor substrate comprising the steps of:

providing a semiconductor substrate with a front surface and a back surface;

forming an insulating layer over said front surface of said semiconductor substrate;

forming a doped region at said back surface of said semiconductor substrate;

plasma etching said insulating layer after said step of forming said doped region; and removing said doped region from said back surface of said semiconductor substrate after said step of performing a plasma etch to said insulating layer.

11. The method of claim 10 wherein said step of providing a semiconductor substrate comprises providing a semiconductor substrate comprised of gallium arsenide.

12. The method of claim 10 wherein said step of forming a doped region at said back surface of said semiconductor substrate comprises the step of implanting a dopant into said back surface of said semiconductor substrate.

13. The method of claim 12 wherein said dopant is implanted at a dosage of $1\times10^{10}$ to $5\times10^{15}$ atoms/cm$^2$.

14. The method of claim 12 wherein said dopant is implanted to a depth of 0.1 to 1.5 $\mu$m from said back surface of said semiconductor substrate.

15. The method of claim 12 further comprising the step of annealing said semiconductor substrate to activate said dopant.

16. The method of claim 10 wherein said step of removing said doped region from said back surface of said semiconductor substrate is performed by polishing.

* * * * *